(12) United States Patent
Bechtel et al.

(10) Patent No.: US 8,256,914 B2
(45) Date of Patent: Sep. 4, 2012

(54) ARRANGEMENT FOR EMITTING MIXED LIGHT

(75) Inventors: Hans-Helmut Bechtel, Roetgen (DE);
Peter J. Schmidt, Aachen (DE);
Matthias Wendt, Wuerselen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/365,668

(22) Filed: Feb. 3, 2012

(65) Prior Publication Data

US 2012/0134134 A1  May 31, 2012

Related U.S. Application Data

(63) Continuation of application No. 12/513,382, filed as application No. PCT/IB2007/054376 on Oct. 29, 2007, now Pat. No. 8,113,675.

(30) Foreign Application Priority Data

Nov. 7, 2006 (EP) .................................. 06123572

(51) Int. Cl.
*F21V 9/16* (2006.01)

(52) U.S. Cl. ......................................... 362/84; 362/231

(58) Field of Classification Search ................ 362/84, 362/230, 231
See application file for complete search history.

(56) References Cited

U.S. PATENT DOCUMENTS

| | | | |
|---|---|---|---|
| 6,373,118 B1 | 4/2002 | Lewyn | |
| 7,126,265 B2 | 10/2006 | Jermann et al. | |
| 2002/0048304 A1 | 4/2002 | Barnes et al. | |
| 2004/0052720 A1 | 3/2004 | Konrad et al. | |
| 2004/0145308 A1 | 7/2004 | Rossner et al. | |
| 2004/0207999 A1 | 10/2004 | Suehiro et al. | |
| 2005/0023548 A1 | 2/2005 | Bhat et al. | |
| 2005/0242360 A1 | 11/2005 | Su | |
| 2006/0244623 A1 | 11/2006 | Pederson | |
| 2008/0187746 A1* | 8/2008 | De Graaf et al. | 428/332 |
| 2009/0091237 A1* | 4/2009 | Hirosaki et al. | 313/495 |

FOREIGN PATENT DOCUMENTS

| | | |
|---|---|---|
| DE | 102004053116 A1 | 5/2006 |
| EP | 1160883 A2 | 12/2001 |
| WO | 2006048064 A1 | 5/2006 |
| WO | 2006072918 A1 | 7/2006 |
| WO | 2006097876 A1 | 9/2006 |
| WO | 2006111907 A2 | 10/2006 |

* cited by examiner

*Primary Examiner* — Evan Dzierzynski
(74) *Attorney, Agent, or Firm* — Mark L. Beloborodov

(57) ABSTRACT

An arrangement for emitting mixed light including a primary and secondary radiation with at least one first electroluminescent light-source for emitting first primary radiation, at least one second electroluminescent light-source for emitting second primary radiation, and a light-converting element for absorbing at least one of the primary radiations and re-emitting the secondary radiation. The light-converting element is arranged so that the entire proportion of primary radiation in the mixed light passes through the light-converting element. The light-converting element is a ceramic light-converting material whose microstructure is selected to be such that the color point of the mixed light of primary and second radiation is substantially independent of the angle of viewing.

10 Claims, 6 Drawing Sheets

ARRANGEMENT FOR EMITTING MIXED LIGHT

CROSS-REFERENCE TO RELATED APPLICATIONS

This application is a continuation filed under 35 USC §120 and claims priority to U.S. patent application Ser. No. 12/513,382 filed May 4, 2009 which is a national stage application of international application No. PCT/IB07/54376 filed Oct. 29, 2007 which itself claims priority to EP 06123572.7 filed Nov. 7, 2006. The instant application claims the benefit of all the listed applications, which are hereby incorporated by reference in their entireties.

FIELD OF THE INVENTION

The present invention relates to an arrangement comprising at least two electroluminescent light-sources and a light-converting element, for the efficient emission of light having a color point not dependent on the angle of viewing.

BACKGROUND OF THE INVENTION

Electroluminescent light-sources (LEDs) emit light in a narrow region of the spectrum. What are termed phosphor-converted LEDs (pcLEDs) convert at least part of the primary radiation emitted by the LED into secondary radiation. This process is called light conversion and the materials used for the purpose are called light-converting materials. A pcLED can thus emit mixed light covering a wider region of the spectrum (wideband emission) as a result of the mixing of primary and secondary radiation. For the light conversion, the LED is coated with, for example, a light-converting layer of a powdered light-converting phosphor material that is embedded in an organic matrix. This arrangement constitutes a simple light-source for emitting wideband light (mixed light produced by the mixing of primary and secondary radiation), and particularly white light. Because of the operating temperatures of LEDs, the optical properties of the light-converting layer change as the time in operation becomes longer, particularly as a result of the organic matrix becoming colored, which means that intensity is not stable over time and there is a shift in the color point of the mixed light.

Document WO2006/072918 A1 describes a phosphor-converted arrangement having a plurality of identically colored blue LEDs, for emitting white light that is produced by mixing blue primary radiation and phosphor-converted secondary radiation. To produce the secondary radiation, use was made of a ceramic light-converting material whose optical properties, and in particular its transmission and its converting capacity, are not sensitive to the effects of temperature during the operation of the LEDs. Given the same light yield per LED, the brightness of the arrangement was increased by using two LEDs. As well as a first light-converting material to produce yellow secondary radiation, the ceramic light-converting layer also comprises in this case a further material for producing red secondary radiation, whereby wideband white light having a high color rendering index is emitted. However, the disadvantages of an arrangement of this kind are the color point of the mixed light, which varies with the angle of viewing, the energy losses that occur in the course of the conversion of the blue primary radiation into red secondary radiation, and the resulting low efficiency of this pcLED arrangement.

It is therefore an object of the present invention to provide an arrangement for the efficient emission of mixed light, which mixed light has a color point that is stable and not dependent on the angle of viewing.

SUMMARY OF THE INVENTION

This object is achieved by an arrangement for emitting mixed light comprising primary and secondary radiation in a mean direction of emission, comprising at least one first electroluminescent light-source for emitting first primary radiation having a maximum intensity at a first wavelength, at least one second electroluminescent light-source for emitting second primary radiation having a maximum intensity at a second wavelength greater than the first wavelength, and a light-converting element for absorbing at least one of the primary radiations and re-emitting the secondary radiation, which light-converting element is so arranged that the entire proportion of primary radiation in the mixed light has passed through the light-converting element, and that the light-converting element comprises a ceramic light-converting material whose microstructure is selected to be such that the color point of the mixed light comprising primary and secondary radiation is substantially independent of the angle of viewing. What is meant by the terms primary radiation and secondary radiation in this case is emitted light of a given range of wavelengths that has a maximum intensity at a given wavelength whose position determines the color of the primary radiation and secondary radiation emitted. Where reference is made below to, for example, blue primary radiation, the maximum intensity of this primary radiation is in the blue region of the spectrum, and the same is true of the secondary radiation.

The color point of the arrangement according to the invention, which is substantially independent of the angle of viewing, is achieved by means of a suitable microstructure for the light-converting materials, such for example as by means of a suitable grain size and/or pore size, which cause the light passing through them to be scattered, and the primary and secondary radiation thus to be mixed, in such a way that the color point of the mixed light is no longer dependent on the angle of viewing. If the scattering effect of the light-converting element is sufficiently great, the same Lambert emission characteristic is obtained for all the components of the mixed light. With a light-converting element having an unsuitable microstructure that produced too small a scattering effect, the angular distribution of the primary radiation would, due to shading-off and/or optical effects, be appreciably different than the angular distribution of the secondary radiation, which latter, due to its isotropic emission within the light-converting material, would have a wide Lambert emission characteristic. Mixed light made up of these components would show a marked variation in its color point as a function of the angle of viewing. If the ceramic material had an unsuitable microstructure that had too severe a scattering effect on the primary and secondary radiation in the light-converting element, the color point of the mixed light would still be independent of the angle of viewing but the back-scatter of the primary radiation caused by the excessively severe scatter would result in excessively high losses of light due to absorption and would thus greatly reduce the efficiency of the arrangement. The light-converting material of the arrangement according to the invention, on the other hand, has a microstructure suitable for maintaining high efficiency while at the same time avoiding a color point dependent on the angle of viewing. The severity of the scatter is set in such a way that an effective mixture of primary and secondary radiation is obtained with any noticeable reduction in the efficiency of the arrangement. To allow the independence of the angle of viewing shown by the color point to be assessed, the spectral emission of the whole arrangement was determined at different angles to the mean direction of emission. The expression "substantially independent of the angle of viewing" means a variation in the color point over the angle of viewing Δu'v' of less than 0.02 and preferably of less than 0.01. In this case, Δu'v' is the vector distance between two color points at different angles of emission in the 1976 CIE color coordinate system.

The use of a second LED to emit second, longer-wavelength primary radiation prevents energy losses of the kind that would occur if the same radiation were produced as secondary radiation from the first primary radiation by light conversion. In one embodiment, the first wavelength is therefore in the blue or ultraviolet region of the spectrum and the second wavelength is in the red region of the spectrum. It is particularly the use of red second primary radiation that prevents large energy losses in the light conversion of the kind that would occur if blue or ultraviolet primary radiation were converted into red secondary radiation. If for example part of the first primary radiation is converted into green secondary radiation, white light can be produced by mixing the red second primary radiation that is not converted in this case by the light-converting element with the blue first primary radiation and the green secondary radiation. In this way, white light can be produced that is of any desired correlated color temperature (CCT), as it is referred to in the art, and that has good color rendering properties of the kind required for lighting purposes. In this way, it is thus possible to design light-sources for which 6000>CCT>2000 K and whose color rendering index Ra is greater than 80. In this case it is necessary for red second primary radiation having a mean emission wavelength of between 600 and 640 nm to be used. The term "CCT" means in this case the correlated color temperature, which is the temperature of a black-body radiator whose color is as close a match as possible.

In one embodiment, the ceramic light-converting material comprises a plurality of oxidic particles whose mean diameter D is between 50 nm and 5000 nm, and preferably between 100 and 3000 nm and, as a particular preference, between 200 and 1000 nm. In a preferred embodiment, the difference between the refractive index of the ceramic light-converting material and the refractive index of the oxidic particles is more than 0.2. In a further embodiment, the ceramic light-converting material comprises, in addition to the oxidic particles, a plurality of pores whose mean diameter is between 250 nm and 2000 nm, and preferably between 500 and 1500 nm and, as a particular preference, between 700 and 1200 nm.

At these sizes for the particles and pores respectively, advantageous scattering behavior by the polycrystalline material is obtained with, at the same time, good mechanical strength and optical stability. The concentration of the scattering particles or the pores is less than 5 vol. % of the polycrystalline material in this case. The light yield (the ratio of the number of photons entering the material to the number of photons emerging from it) is for example better than 80% for a polycrystalline ceramic material having pores of sizes of this kind. What is meant here by the terms pore size and particle size is the diameter of a sphere of the same volume as, respectively, the corresponding pore and particle. The particles and pores in the polycrystalline material need not necessarily be of a sphere-like shape. In both cases the scattering effect is achieved by an abrupt change in refractive index. In the case of air-filled pores, this is the difference in refractive index between the polycrystalline material and air. In the case of oxidic particles, particles of $Al_2O_3$ for example have a refractive index of 1.76, which is less than that of the surrounding material that may typically be 1.8-2.5. The greater the difference in refractive index, the greater is the scattering effect of pores or particles.

In another embodiment, what exists in the light-converting material is optical anisotropy, i.e. the refractive index of the crystal structure differs along different axes of the crystals. In this case the difference in refractive index is generally less than 0.2 and more than 0.01 and advantageous scattering of light can be obtained solely as a result of scattering at the grain boundaries of the polycrystalline material. The size of the crystallites, meaning the diameter of a sphere of equal volume, is between 1 μm and 30 μm. In a further embodiment, the crystalline regions of the polycrystalline material are connected by non-crystalline regions, so-called glass phases. In this case too, the difference in refractive index between crystalline and non-crystalline regions can be made use of to set the desired scattering properties.

In a preferred embodiment, the density of the ceramic light-converting material is more than 97% of the theoretical maximum density of the corresponding crystalline material. Because of this high density, what is obtained when the scattering behavior is as desired is good mechanical strength and optical stability and greater efficiency in the case of the light yield.

In a further embodiment, the light-converting element is coupled optically to the first and second electroluminescent light-sources, preferably by a layer of silicone between the light-converting element and the light-sources. This ensures good coupling of the light into the light-converting element, which has a beneficial effect on the efficiency of the arrangement.

In a further embodiment, the light-converting element comprises, on the side-faces having surface normals substantially perpendicular to the mean direction of emission of the mixed light, a reflective layer. Due to the light-scattering effect of the light-converting element, some of the mixed light strikes these side-faces and, if it were to emerge from the light-converting element laterally, would be lost for emission in the direction of emission or possibly, in many embodiments, would result in the color point becoming angle-dependent. This being the case, making the side-faces reflective ensures that the color point is highly stable.

In a further embodiment, the intensities of the first and second primary radiations can be set in a variable manner, independently of one another, by means of an operating unit. The color point of the mixed light can be varied in this way during the operation of the arrangement according to the invention. The intensities that are able to be set independently of one another are obtained by means of first and second LEDs able to be driven independently of one another. This can for example be done by using an operating unit that comprises two electronic drivers for applying two independent operating voltages to the first and second LEDs, which latter are isolated from one another electrically. By means of the conversion of all or part of first primary radiation into one or more, different, secondary radiations, and conversion of the second primary radiation of variable intensity that can be switched on, the setting of the color point can be arranged to be highly variable as a result of the independent driving of the first electroluminescent light-source or light-sources (independent selection of the operating voltage for the second electroluminescent light-source).

The possible variations in the color point depend in this case on the primary radiations from the LEDs and the composition and sizing, i.e. absorbing capacity, of the light-converting element. By selecting the wavelengths at which the primary and secondary radiations are at their maximum intensities, the person skilled in the art can decide the color point of the mixed light emitted by the arrangement according to the invention, and the color space within the CIE chromaticity diagram, in which, when the intensities of the first and second primary radiations can be set independently, the color point can be adjusted to the nature of the use that is to be made of the arrangement according to the invention.

In other embodiments of the arrangement according to the invention further, such for example as third and fourth or even more, electroluminescent light-sources may be used in addition to the first and second electroluminescent light-sources. The advantages and properties described above apply equally in this case. If the said additional electroluminescent light-sources are to be operated independently of one another to allow the intensities of light emitted by them to be set independently, the operating unit will comprise third or more drivers to allow the appropriate operating voltages to be applied.

The invention also relates to a light-converting element intended for emitting mixing light produced from primary and secondary radiation in a mean direction of emission, and for absorbing at least one of the primary radiations and re-emitting the secondary radiation, which light-converting element comprises a ceramic material whose microstructure is selected to be such that the color point of the mixed light produced from primary and secondary radiation is substantially independent of the angle of viewing.

These and other aspects of the invention are apparent from and will be elucidated with reference to the embodiments described hereinafter.

DETAILED DESCRIPTION

Figure 1:
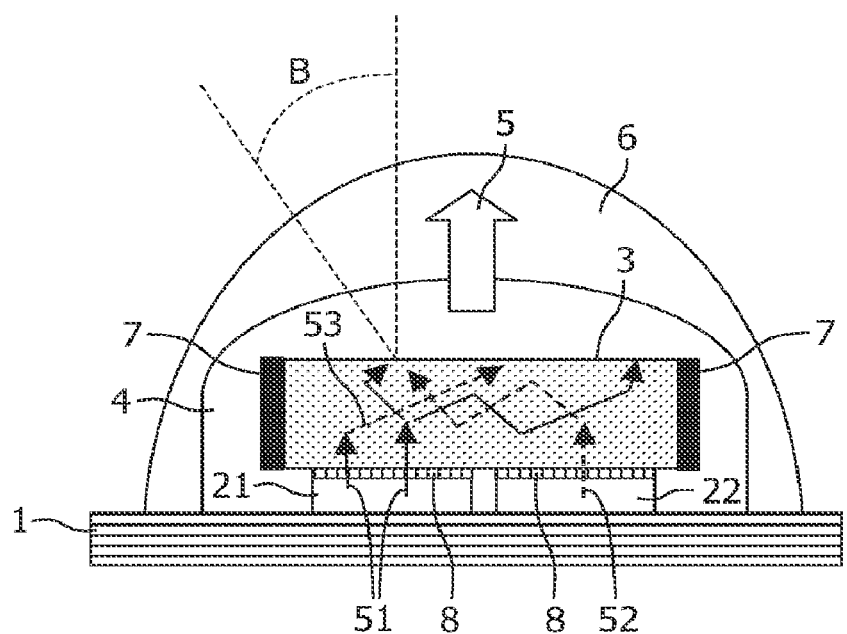
FIG. 1 is a side view of an embodiment of a phosphor-converted arrangement according to the invention.

FIG. 1 is a schematic side view of an embodiment of arrangement according to the invention for emitting mixed light 5, having a substrate 1 and, applied to the substrate 1, two electroluminescent light-sources 21 and 22 for emitting first primary radiation 51 (first electroluminescent light-source 21) and second primary radiation 52 (second electroluminescent light-source 22), and a light-converting element 3 arranged on the first and second electroluminescent light-sources 21 and 22, for absorbing at least part of at least the first primary radiation 51 and for emitting secondary radiation 53 and for mixing the primary and secondary radiation by the distribution of light (the scattering of light in the present case). An electroluminescent light-source may for example comprise inorganic LEDs, organic LEDs (OLEDs) or laser diodes in this case. To perform the function of converting light and distributing light, the light-converting element has to be arranged in the beam path of the first and second electroluminescent light-sources 21 and 22. In alternative embodiments, the light-converting element 3 need not necessarily be fixed to the electroluminescent light-sources 21 and 22. Depending on the first and second wavelengths selected for the first and second primary radiations 51 and 52 and on the light-converting material selected, it is possible, in alternative embodiments, for at least part of the second primary radiation 52 too to be absorbed by the light-converting element 3 and converted into second secondary radiation. To produce white light, in a preferred embodiment a blue LED is operated together with a red LED, part of the blue primary radiation 51 being converted into green and/or yellow secondary radiation by means of the light-converting material, thus giving, if the mixing with the red second primary radiation 52 is in the correct ratio, white light 5 having a high color rendering index. In the present case the red light is not produced by light conversion by means of an appropriate light-converting material but is supplied directly by a red LED, which prevents conversion losses (e.g. blue→red) and thus increases the efficiency of the arrangement.

In the embodiment shown in FIG. 1, the light-converting element 3 is for example coupled optically to the first and second electroluminescent light-sources 21 and 22. The optical coupling at 8 may for example be performed by a layer of silicone having a refractive index of 1.5. In other embodiments, what may also be used for the optical coupling are light-guiding elements, such as glass fibers for example.

Along the path followed by the light from the electroluminescent light-sources 21 and 22 to the point where the primary radiations 51 and 52 enter the light-converting element 3, the optical coupling at 8 prevents the light from crossing into a medium having a low refractive index. A crossing of this kind would result in a higher proportion of the primary radiation 51 and 52 being reflected back as a result of total reflection effects when it left the electroluminescent light-sources 21 and 22, which would result in additional light losses. In addition to this, it is also advantageous if the light-converting element 3 is brought into close contact with the electroluminescent light-sources 21 and 22, to give a compact arrangement.

In the embodiment shown in FIG. 1, the light-converting unit 3 comprises a light-converting material made, for example, of polycrystalline ceramic material. The light-scattering effect of the light-converting material is produced by oxidic particles of a size of between 50 nm and 5000 nm that are situated in the light-converting material. Particles of $Al_2O_3$, for example, having a refractive index of 1.76 could act as scattering centers in a doped YAG ceramic. A material of this kind typically has a refractive index of the order of 1.8-2.5. The pores that are present in these materials between the individual crystallites are as a rule filled with air and therefore have a refractive index of 1. The differences in refractive index between the pores and the light-converting material produces further scattering of light at the grain boundaries, which distributes the light over the light-converting element 3 to an additional degree. If the pores are of a suitable size, such as between 250 nm and 2900 nm, for example, and if the pore concentration is 1.5 vol. %, then, if the thickness of the light-converting element is 100 μm, the light is scattered in such a way that optimum light distributing properties are obtained on the part of the light-converting element 3. Both provisions (pores and oxidic particles) may be made together in one material. As from a thickness that depends on the scattering power, the primary radiations 51 and 52 that are emitted by the different electroluminescent light-sources 21 and 22 are mixed together homogeneously which, together with the secondary radiation 53 emitted by the light-converting element 3, gives a homogeneous perceived color. The emission of the secondary radiation 53 takes place isotropically in the light-converting element 3, which facilitates good mixing with the primary radiations 51 and 52.

On the emergence of the primary and secondary radiation from the light-converting element 3, the phosphor-converted arrangement emits mixed light in a mean direction of emission 5. The mixed light 5 is composed of second primary radiation 52, secondary radiation 53, and possibly first primary radiation 51 if, due to its absorptive properties, the light-converting element 3 is at least partly transparent to the first primary radiation 51. If the scattering effect of the light-converting element 3 is sufficiently great, the same Lambert emission characteristic is obtained for all the components of the mixed light 5, which means that the color point of the mixed light 5 no longer depends on the angle of viewing B. With a light-converting element 3 having an unsuitable microstructure that produced too small a scattering effect, the angular distribution of the primary radiation 51, 52, as determined by the optics of the primary radiant source and any possible shading-off in the arrangement, would be substantially parallel to the mean direction of emission 5, whereas the secondary radiation 53, due to its isotropic emission within the light-converting material, would have instead a wide Lambert emission characteristic. Mixed light made up of these components would show a wide variation in the color point as a function of the angle of viewing. If the ceramic material had an unsuitable microstructure that produced too great a scattering effect on the primary and secondary radiation 51, 52 and 53 in the light-converting element 3, although the color point of the mixed light would still be independent of the angle of viewing, the reflection of the primary and secondary radiation 51, 52 and 53 in the light-converting element 3 caused by the excessive scattering would mean that there would be too high an absorption rate, involving high proportions of lost, non-radiated light, and would thus greatly reduce the efficiency of the arrangement. The light-converting material of the arrangement according to the invention by contrast has a microstructure that is suitable for maintaining high efficiency while at the same time avoiding a color point that is dependent on the angle of viewing.

To allow the color point of the mixed light 5 to be set in a variable manner, in alternative embodiments the first and second electroluminescent light-sources 21 and 22 are driven independently of one another, by different electronic drivers for example. If, for example, the first electroluminescent light-source 21 is operated at a fixed operating voltage, the color point of the mixed light 5 can be shifted towards the color of the second primary radiation 52 if the operating voltage of the second electroluminescent light-source 22 is increased. If it is lowered, the color point shifts towards the color point given by the first primary radiation 51 and by the secondary radiation 53 produced by the conversion of at least part of the first primary radiation 51. Depending on the light-converting material that is selected in the light-converting element 3, the secondary radiation 53 may also be composed of a plurality of different regions of the spectrum (a plurality of secondary sub-radiations) by using different light-converting materials in a mixture. In other embodiments, the whole of the first primary radiation 51 may be converted into secondary radiation 53, and for example ultraviolet first primary radiation 51 can be converted, by suitable converting materials, into different secondary radiations 53, such for example as blue, yellow or green secondary radiations, to produce mixed light 5 that is white or of some other color. It is, however, also possible for all or part of blue first primary radiations 51 or of primary first radiations 51 of some other color to be converted into radiation of even longer wavelengths. By the addition of, for example, second red primary radiation 52, white light is obtained that has a variable color point and that is, in addition, distinguished by its wide-band emission with a high color rendering index.

In a preferred embodiment, the maximum intensity of the first primary radiation 51 is at a first wavelength of between 200 nm and 490 nm and the maximum intensity of the second primary radiation 52 is at a second wavelength of between 500 nm and 800 nm. The light-converting material is distinguished in this case by the fact that it does not absorb or convert the second primary radiation 52. This ensures that there is a high proportion of red in the mixed light 5 which, with suitable phosphor-converting materials, gives white light having a color temperature of less than 4000 K and high efficiency on the part of the arrangement according to the invention.

In a further embodiment, those sides of the light-converting element 3 that are substantially perpendicular to the mean direction of emission of the mixed light 5 are made reflective by means of a reflective layer 7. The reflective layer 7 may, for example, comprise aluminum of a thickness of more than 30 nm. This means that the light 51, 52, 53 that, due to the light-distributing effect according to the invention of the light-converting element 3, propagates in the light-converting element 3 at high angles to the mean direction of emission 5 cannot leave the light-converting element 3 laterally and thus causes the arrangement according to the invention to be of greater brightness in the direction of the mean direction of emission 5.

In FIG. 1, an embodiment of arrangement according to the invention also comprises a lens 6 that encloses the electroluminescent light-sources 21 and 22 and the light-converting unit 3. The emission properties of the arrangement according to the invention can be acted on by means of the lens 6 to, for example, focus, defocus or divert the mixed light 5. Shown in FIG. 1, by way of example, is an embodiment having a spherical lens 6 having a volume of space 4 between the light-converting element 3 and the electroluminescent light-sources 21 and 22 that is not filled by the lens 6. The volume of space 4 may, however, also be filled with, for example, silicone rubber. In other embodiments, the lens may be of a form such that the lens 6 encloses the converting element 3 and the electroluminescent light-source 2 directly without a volume of space 4 being formed. In other embodiments, the arrangement according to the invention may also be operated without a lens 6 (and hence without a volume of space 4).

Figure 2:
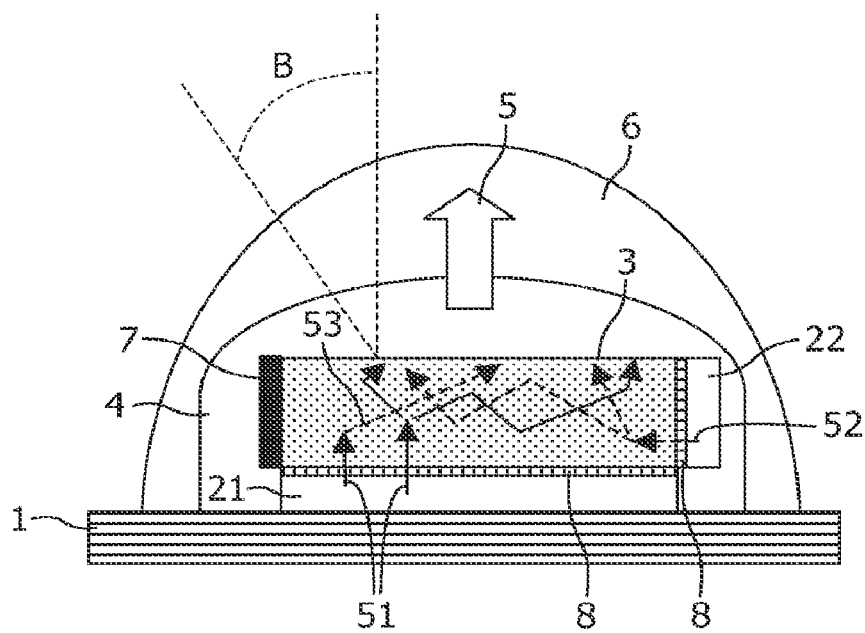
FIG. 2 is a side view of a further embodiment of a phosphor-converted arrangement according to the invention.

FIG. 2 shows a further embodiment of arrangement according to the invention in which, in contrast to the embodiment shown in FIG. 1, the second electroluminescent light-source 22 is coupled to the light-converting element 3 laterally relative to the mean direction of emission 5. In this arrangement, the second primary radiation 52 is coupled into the light-converting element 3 at right angles to the first primary radiation 51, which produces good mixing of the two primary radiations even when the light-scattering effect of the phosphor-converting material is not so very great. In other embodiments, the arrangement according to the invention may also be operated without a lens 6 (and hence without a volume of space 4).

Figure 3:
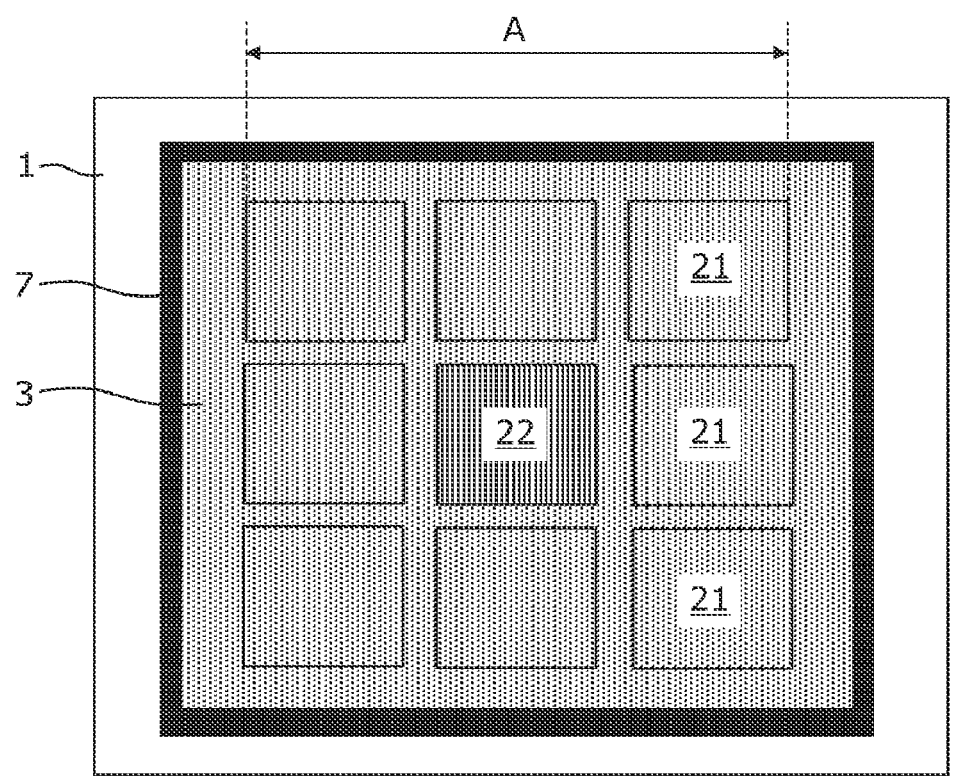
FIG. 3 is a plan view of a further embodiment of a phosphor-converted arrangement according to the invention.

FIG. 3 is a plan view of a further embodiment of arrangement according to the invention. In this case, eight first electroluminescent light-sources 21 are positioned, in an area, in a 3×3 arrangement with an edge-length A, with a second electroluminescent light-source 22 in the center of this arrangement. The shaded area represents the light-converting element 3 that, looking in the direction of emission, is arranged above the light sources and whose lateral faces are made reflective by means of a reflective layer 7. To ensure that the two primary radiations 51 and 52 are mixed in their entirety, the light-converting element 3 may, for example, be of a thickness D that, in the mean direction of emission of the light, is equal to or greater than the edge length A. The fact of the second electroluminescent light-source 22 being centrally positioned provides additional assistance with the mixing of the two primary radiations 51 and 52. It would also be possible for the second electroluminescent light-source 22 to be arranged at the edge of an arrangement of this kind if either the light-distributing properties of the light-converting element were greater or its thickness D were larger.

In a further embodiment, the arrangements according to the invention may comprise a light-converting element 3 that is also made reflective, on the side adjacent the electroluminescent light-sources 21 and 22, in those regions by which no primary radiation 51 or 52 is coupled into the light-converting element 3. Because of this, no retro-reflected or back-scattered primary and/or secondary radiation 51, 52 or 53 is able to leave the arrangement according to the invention in a direction opposite from the mean direction of emission 5, which increases the brightness of the arrangement in the direction of the mean direction of emission 5.

Figure 4:
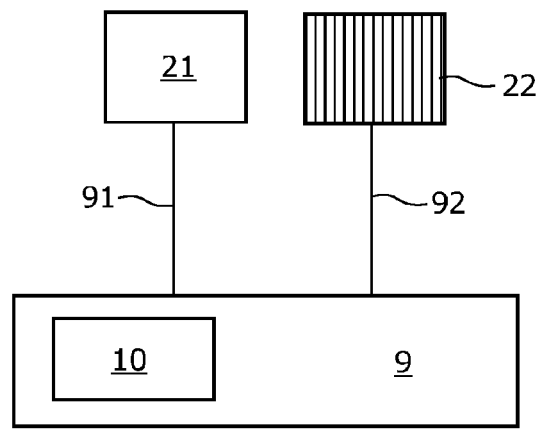
FIG. 4 shows the means for driving the phosphor-converted arrangement according to the invention.

To allow the color point of the mixed light 5 emitted by the arrangement according to the invention to be set in variable manner, the second electroluminescent light-source 22 has to be operated independently of the first electroluminescent light-source 21. FIG. 4 shows an embodiment for this purpose in which an operating unit 9 applies a first operating voltage to the first light-source 21 by means of electrical connecting means 91 and a second operating voltage to the second light-source 22 by means of connecting means 92 able to be operated independently of the first means. The first and second operating voltages can be set by the operating unit 9 to be different, in a variable manner, by means of appropriate drivers. Drivers of this kind are known in the prior art. Because the brightness of the primary radiations 51 and 52 emitted is proportional to the operating voltage, any desired brightness ratios can thus be set between the first and second primary radiations and the color point of the mixed light made up of the primary and secondary radiation can thus be shifted accordingly. In a further embodiment, the operating unit 9 comprises a control unit 10 having a memory area in which are stored the color points able to be set with the arrangement according to the invention as a function of the individual operating voltages. The control unit 10 is then able to set the color point of the mixed light 5 as desired by taking the desired stored values. The control unit 10 may also comprise algorithms for compensating for the effects of ageing (by, for example, adjusting the current as a function of time relative to the original current level at the time of initial operation), which algorithms would cause a shift in the color point and would thus, by means of a timer, make a correction throughout the working life to allow a given color point to be stabilized.

For the light-converting element 3 to give the light-distributing effect according to the invention, the phosphor-converting material of the converting layer must have a suitable light-scattering effect. This suitable light-scattering effect is achieved by making the material either a polycrystalline ceramic material that has a plurality of pores of a mean diameter of between 250 nm and 2900 nm, or a plurality of oxidic particles of a diameter of between 50 nm and 5000 nm, or making it a combination of corresponding pores and oxidic particles. The refractive index of the pores and the oxidic particles must be appreciably different from the refractive index of the phosphor-converting material in this case. The light-scattering effect becomes all the greater, the greater is the difference between the refractive indexes and/or the greater is the number of scattering centers of this kind. Whereas the refractive index of the pores, which are typically air-filled pores for which n=1, differs appreciably from that of any phosphor-converting material, the oxidic particles should have a refractive index that is lower than that of the light-converting material, being, for example, particles of $Al_2O_3$ having a refractive index of 1.76.

An example of a light-converting material according to the invention is a cerium-doped YAG ceramic that is produced as follows:

The ceramic material is produced from a mixture of 100 g of $Al_2O_3$ (mean grain size 0.35 μm, purity 99.99%), 120.984 g of $Y_2O_3$ (mean grain size 0.70 μm, purity>99.99%), 21.835 g of $Gd_2O_3$ (mean grain size 0.40 μm) and 1.0197 g of $CeO_2$ (mean grain size 0.40 μm, purity>99.0%) that is milled for an hour with 850 ml of isopropanol and 5.0 kg of aluminum oxide milling balls (diameter 2 mm) in a roller mill. The quantitative amounts given allow for the loss of water and $CO_2$ from the powder at incandescence and are therefore greater than the amounts that will subsequently be present in the ceramic material. The losses by incandescence are determined by heating to incandescence in air at 1200° C. until the weight is constant. The dried mixture in powder form is then processed into a granular material with a polyvinyl binder and dried at 110° C. The granular material is then pressed uniaxially into a green compact and is recompressed in a cold isostatic press at a pressure of 3.2 kbar. After a step comprising the burning out of the binder at 600° C. in air, the green compact is sintered for 2 h at 1750° C. in an atmosphere of CO. What is obtained after the sintering is a ceramic material 31 of a density of 4.66 g/cm$^3$, which corresponds to a relative density of 98.73%. After the post-processing of the ceramics by grinding, polishing and sawing, the individual converter wafers are post-annealed again for 4 h in air at 1350° C. As an alternative to a ceramic Gd-YAG:Ce material, what may also be produced by the appropriate method, in other embodiments, for the conversion of at least part of primary radiation of wavelengths from 420 nm to 480 nm into longer-wavelength secondary radiation are the following materials: $Lu_{3-x-y}Y_xAl_5O_{12}:Ce_y$, where $0 \leq x \leq 1$, $0.001 \leq y \leq 0.1$ and the secondary radiation is at 515-540 nm, $Y_{3-x-y}Tb_xAl_5O_{12}:Ce_y$, where $0 \leq x \leq 1$, $0.001 \leq y \leq 0.1$ and the secondary radiation is at 550-590 nm or $Lu_{3-x-y-z}Y_xAl_{5-a}Si_aO_{12-a}N_a:Ce_yPr_z$ where $0 \leq x \leq 1$, $0.001 \leq y \leq 0.1$, $0.0005 \leq z \leq 0.01$, $0.01 \leq a \leq 0.8$ and the secondary radiation is at 540-630 nm.

Other oxidic materials such as $(Sr_{1-x-y}Ca_xBa_y)_{2-z}SiO_4:Eu_z$, where $0 \leq x \leq 0.4$, $0 \leq y \leq 0.8$, $0.001 \leq z \leq 0.01$ and the secondary radiation is at 520-600 nm can be produced by the following methods:

mixing and calcining of $SrCO_3$, $CaCO_3$ and, as an option, $BaCO_3$ with $Eu_2O_3$ and $SiO_2$ at 1100° C. in a reducing atmosphere milling of the raw phosphor powder hot-pressing of the raw phosphor powder at 1300° C.-1400° C. at a pressure of 20-100 Mpa under vacuum or in an inert or reducing atmosphere.

What may be used as ceramic materials are cubic materials, such as YAG for example, or non-cubic materials such for example as orthosilicates such as $(Sr_{1-x-y}Ca_xBa_y)_{2-z}SiO_4:Eu_z$. Non-cubic materials have different refractive indexes in different directions in space because the crystal structure is different in different orientations. There are said to be different crystallographic axes. Therefore, due to the orientation in space of different regions (crystallites or grains) in the polycrystalline ceramic material, the refractive index may change along the path followed by the light, even though the composition remains the same. As a function of the difference in refractive index along different crystallographic axes in non-cubic materials, the scattering power required in material of this kind is set by means of additional scattering centers (particles or pores).

The size of the oxidic particles in a polycrystalline ceramic material can also be set by way of the conditions of production. Taking the example of YAG:Ce (primary phase) having $Al_2O_3$ oxidic particles (secondary phase) the scatter can be set, independently of pores, by way of the concentration and grain size of the $Al_2O_3$ starting powder that is used. A YAG ceramic containing an excess of Al forms an $Al_2O_3$ secondary phase whose grain size is approximately 2 to 10 times the grain size of the $Al_2O_3$ powder used. In this way, there is obtained, in a YAG:Ce ceramic containing a 5% excess of Al for which an $Al_2O_3$ powder having a mean grain size of 400 nm is used, approximately a proportion amounting to 4% by weight of an $Al_2O_3$ secondary phase (a slight excess of Al can be tolerated in the YAG lattice due to antisite defects) having a grain size of 1-4 μm. If, for example, an $Al_2O_3$ powder having a mean grain size of 1 μm were used, then in this case too the grain sizes of the secondary phase would be at least as large as those of the powder used but could also be appreciably larger. For the same concentration of the secondary phase, the mean diameter of its grains is all the smaller (more scatter) the smaller is the mean diameter of the oxidic precursor constituent (starting material) that is used and that forms the secondary phase. With ceramic materials that are different in the appropriate way, other suitably produced secondary-phase particles may also be used for the scattering of light in place of $Al_2O_3$.

Figure 5:
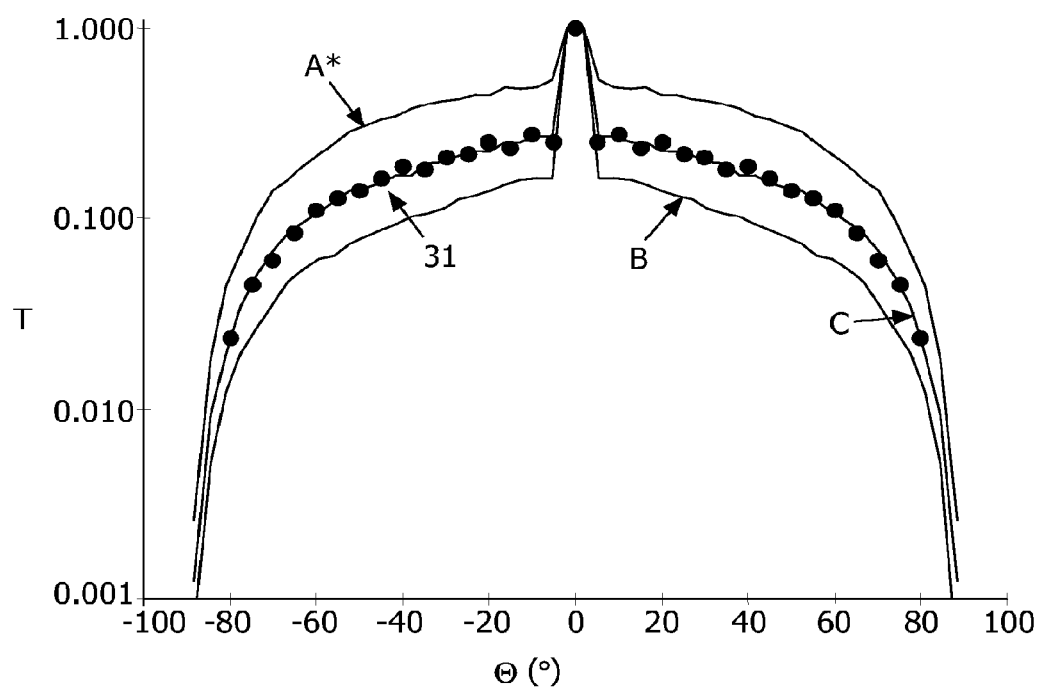
FIG. 5 shows transmission T as a function of the angle of transmission Θ for light of a wavelength of 660 nm incident, perpendicularly, on a converting layer, compared with light distributions found by calculation for determining the pore diameter of the polycrystalline material of the converting layer.

The size of the pores contained in the polycrystalline ceramic material may be determined by a measurement of the scattering of light, as is shown by way of example in FIG. 5. In this case, a wafer of a ceramic light-converting material of a thickness of 150 μm was illuminated by a laser having a wavelength of 660 nm perpendicularly to the plane of the cut and the light distribution after passing through the polycrystalline ceramic material (transmission T) was determined for a range of angles Θ to the normal to the wafer from −80° to 80°. The measured results are shown as a dotted curve in FIG. 6, together with the light distributions calculated for the Mie scattering, that occurs in the polycrystalline ceramic material used, at particles having a refractive index n=1 (pores filled with air) (solid curves A*, B, C), as calculated for three different pore diameters. What is meant by Mie scattering is the scattering of electromagnetic waves at spherical objects. In the Figure, curve A is the light distribution for a pore diameter of 700 nm, curve B is that for a pore diameter of 900 nm and curve 31 is that for a pore diameter of 800 nm. Curve C is an excellent match to the light distribution measured, which gives a mean pore diameter of 800 nm for the polycrystalline ceramic material.

Figure 6:
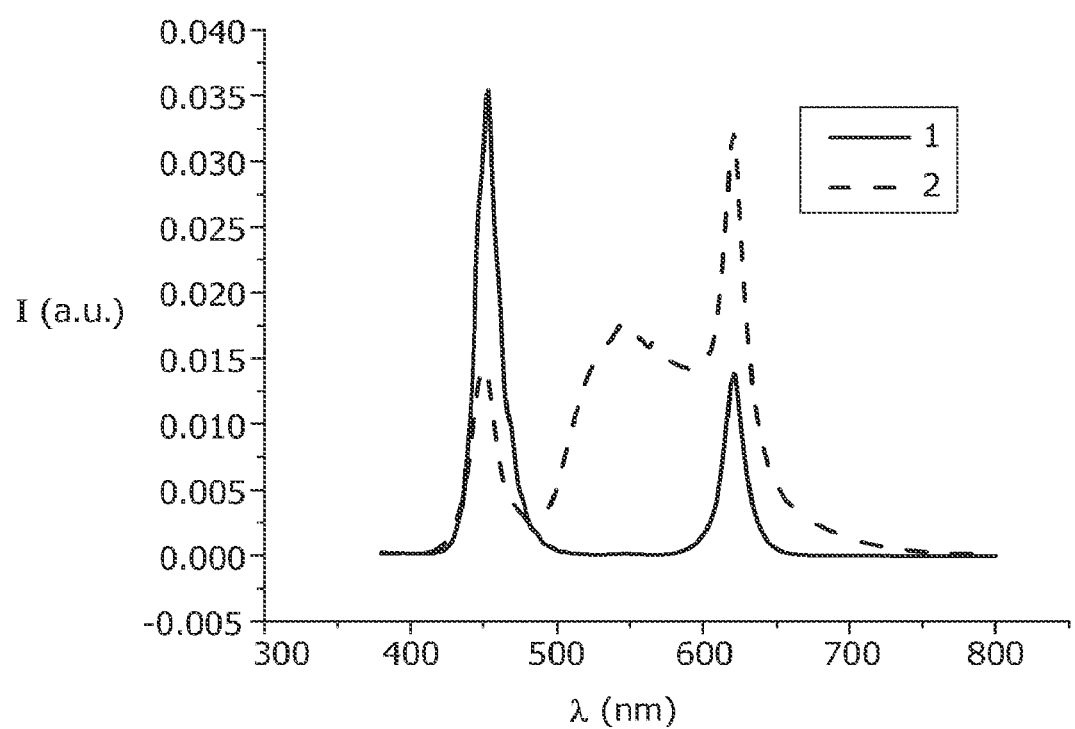
FIG. 6 shows the emission spectrum (intensity I) of a red and a blue LED as a function of wavelength λ, when there is a light-converting element present (solid line) and when there is no light-converting element (dashed line).

FIG. 6 shows the emission spectrum of an arrangement according to the invention for emitting mixed light. In the Figure, the intensity of the primary and secondary radiation emitted (in arbitrary units) is plotted as a function of wavelength λ in nanometers. The solid curve represents the emission spectrum of the primary radiation emitted by the first and second electroluminescent light-sources 21 and 22 before it passes through the light-converting element 3. The dashed line represents the resulting emission spectrum of the mixed light after the primary radiation has passed through the light-converting element, which in the present example comprises a light-converting material whose composition is $Y_{2.64}Gd_{0.3}Ce_{0.06}Al_5O_{12}$, whose density is 99% of the theoretical maximum density of the corresponding crystalline material, and whose thickness in the direction of the mean direction of emission is 150 μm. In this example, the mixed light 5 from the arrangement according to the invention has a correlated color temperature of 3622 K for a lumen equivalent of 367 lm/W, a color rendering index Ra=84, color coordinates of x=0.4074 and y=0.4124 and a maximum variation in color point over the angle of viewing Δu'v'=0.008. A tiny variation in color of this kind is not perceptible to the viewer and the color point is thus no longer dependent for the viewer on the angle of viewing.

Figure 7:
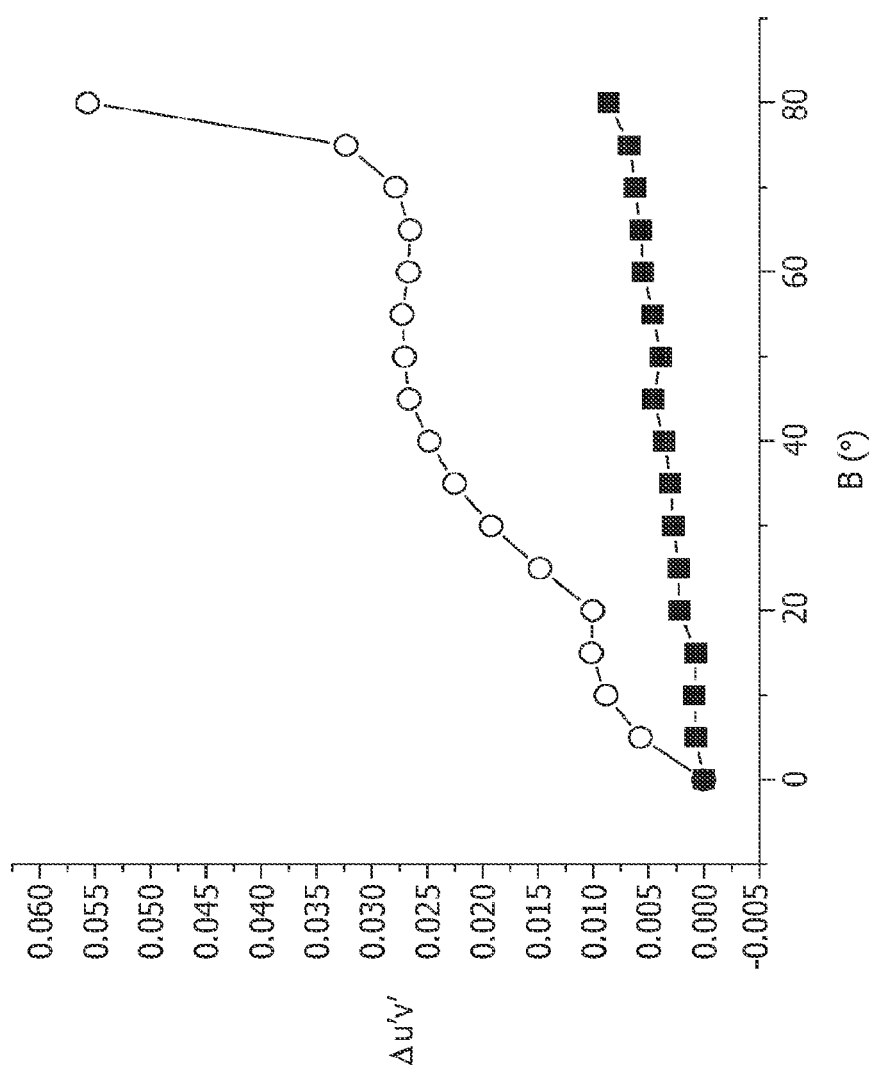
FIG. 7 shows the change in color point Δu'v' as a function of the angle of viewing B for an arrangement according to the invention (■) and a prior art arrangement (○).

FIG. 7 shows the change in color point Δu'v' as a function of the angle of viewing B for the arrangement according to the invention to which FIG. 6 relates, having a blue first and a red second electroluminescent light-source, compared with a prior art phosphor-converted arrangement (◦) having merely a blue electroluminescent light-source. The same light-converting material $Y_{2.64}Gd_{0.3}Ce_{0.06}Al_5O_{12}$, having a density of 99% of the theoretical maximum density of the corresponding crystalline material and a thickness of 150 μm in the direction of the mean direction of radiation, was used for both arrangements. The blue electroluminescent light-sources had a color point at x=0.1495 and y=0.0309 in the CIE 1931 chromacity diagram and the red electroluminescent light-source had a color point at x=0.6760 and y=0.3238 in the CIE 1931 chromacity diagram. Whereas the prior-art arrangement shows a variation in the color point of up to 0.055 over the angle of viewing Δu'v', this variation is lower by a factor of more than 6 in the case of the arrangement according to the invention. A variation of Δu'v'=0.055 can easily be perceived by a viewer. Therefore, in contrast to the arrangement according to the invention, in the prior-art arrangement the color point is very much dependent on the angle of viewing.

Figure 8:
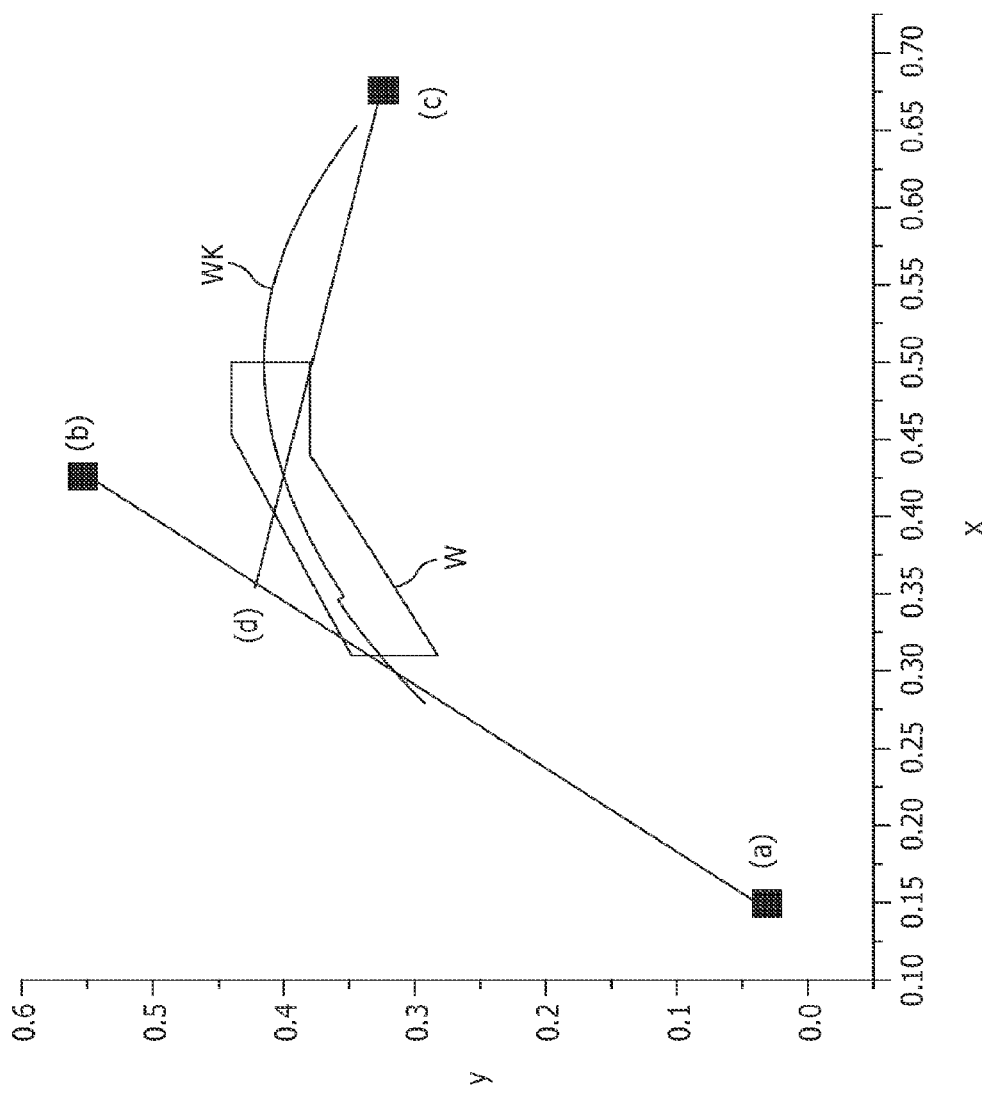
FIG. 8 shows examples of color coordinates of LEDs and a converting element.

FIG. 8 shows, in schematic form, the color points in the CIE 1931 chromacity diagram that are able to be set with the arrangement according to the invention to which FIGS. 6 and 7 relate, when the intensities of the light emitted by the first and second light-sources can be set independently of one another. In this case, (a) is the color point of the blue first electroluminescent light-source, (c) is the color point of the red second electroluminescent light-source and (b) is the color point of the light-converting element that is determined by the light-converting material that is selected. The color point (d) is set by selecting the thickness and absorbing capacity of the light-converting element for the first primary radiation having the color point (a). By varying the conditions of operation of the first and second electroluminescent light-sources by means of the operating unit, and by means of the resulting variation in the intensities of the first and second primary radiations, the color point of the mixed light 5 can be set as desired along the straight line between (d) and (c). The area marked W is the SAE color white area and the curve marked WK is the CIE defining curve for white light.

The embodiments that have been elucidated by reference to the drawings and the description are only examples of an arrangement according to the invention for emitting mixed light and of a light-converting element and are not to be construed as limiting the claims to these examples. Alternative embodiments are also conceivable by the person skilled in the art, and these too are covered by the scope of the claims. The numbering of the dependent claims is not intended to imply that other combinations of the claims do not also constitute advantageous embodiments of the invention.

What is claimed is:

1. A light-converting element for mixing light, comprising:
    a first light source emitting a first primary radiation and a second light source emitting a second primary radiation;
    a ceramic light converting element positioned over said first light source and said second light source and converting at least one of said primary radiations as an emitted secondary radiation;
    an optical coupling layer positioned between said ceramic light converting element and said first light source and said second light source;
    said ceramic light converting element having a microstructure selected to be such that the color point of the mixed light produced from said primary and said secondary radiation is substantially independent of an angle of viewing;
    said ceramic light-converting material having a plurality of oxidic particles having a mean diameter of between about 50 nm to about 3000 nm, said ceramic light-converting material further having a plurality of pores having a mean diameter of between about 250 nm to about 2000 nm.

2. The light converting element of claim 1 wherein said ceramic light converting element has a side wall, said side wall including a reflective layer.

3. The light converting element of claim 1 wherein said first light source is positioned at about a right angle relative to said second light source.

4. The light converting element of claim 1 wherein the first wavelength is in the blue or ultraviolet region of the spectrum and the second wavelength is in the red region of the spectrum.

5. The light converting element of claim 1 wherein the difference between the refractive index of said ceramic light-converting material and the refractive index of said oxidic particles is more than 0.2.

6. The light converting element of claim 1 wherein the density of the ceramic light-converting material is more than 97% of the theoretical maximum density of a corresponding crystalline material.

7. A light-converting element for mixing light, comprising:
    a first light source emitting a first primary radiation and a second light source emitting a second primary radiation;
    a ceramic light converting element positioned over said first light source and said second light source and converting at least one of said primary radiations as an emitted secondary radiation;
    said ceramic light converting element having a microstructure selected to be such that the color point of the mixed light produced from said primary and said secondary radiation is substantially independent of an angle of viewing;
    said ceramic light-converting material having a plurality of oxidic particles, said ceramic light-converting material further having a plurality of pores;
    wherein said first light source includes a plurality of light emitters substantially surrounding said second light source, said light converting element having a side wall substantially surrounded by a reflective layer.

8. The light converting element of claim 7 wherein said reflective layer is an aluminum layer with a thickness of more than 30 nm.

9. The light converting element of claim 7 wherein said oxidic particles have a mean diameter of between about 200 nm to about 1000 nm, said plurality of pores have a mean diameter of between about 700 nm to about 1200 nm.

10. A light-converting element for mixing light, comprising:
    a first light source emitting a first primary radiation and a second light source emitting a second primary radiation;
    a ceramic light converting element positioned over said first light source and said second light source and converting at least one of said primary radiations as an emitted secondary radiation;
    an optical coupling layer positioned between said ceramic light converting element and said first light source and said second light source;
    said ceramic light-converting material having a plurality of oxidic particles having a mean diameter of between about 50 nm to about 3000 nm, said ceramic light-converting material further having a plurality of pores having a mean diameter of between about 250 nm to about 2000 nm;
    wherein said ceramic light converting element has a side wall, said side wall including a reflective layer substantially surrounding said light converting element.

* * * * *